Figure 1:
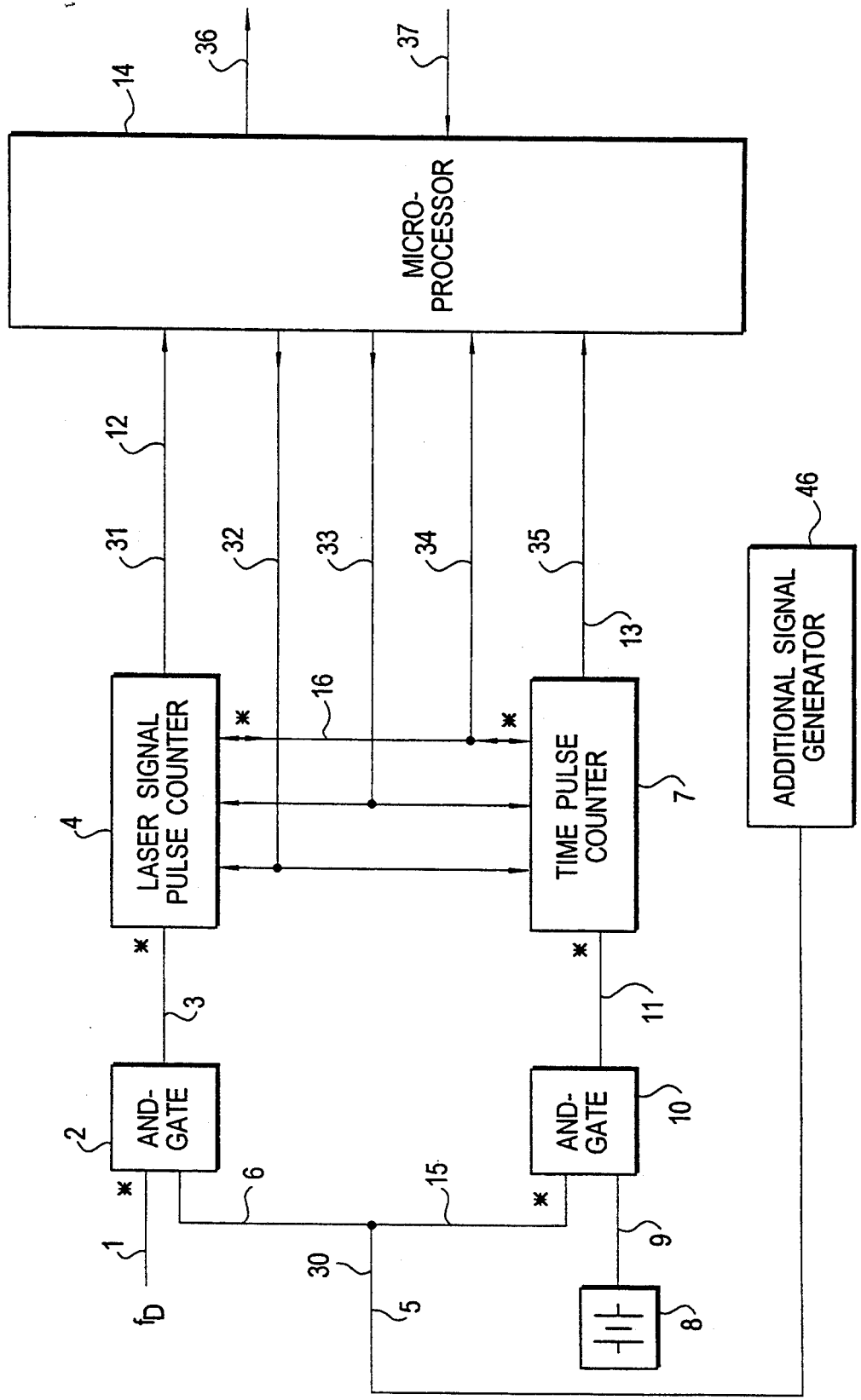

United States Patent [19]

Gondrum et al.

[11] Patent Number: 5,343,285
[45] Date of Patent: Aug. 30, 1994

[54] ELECTRICAL CIRCUIT FOR MEASURING THE FREQUENCY OF LASER DOPPLER SIGNALS

[75] Inventors: Uwe Gondrum, Datteln; Martin Fütterer, Schwerte; Frank Milbradt, Dortmund; Volker Grebe, Bochum, all of Fed. Rep. of Germany

[73] Assignee: Mesacon Gesellschaft fur Mebtechnik mbH, Fed. Rep. of Germany

[21] Appl. No.: 941,130

[22] PCT Filed: Mar. 6, 1992

[86] PCT No.: PCT/EP92/00500
§ 371 Date: Nov. 6, 1992
§ 102(e) Date: Nov. 6, 1992

[87] PCT Pub. No.: WO92/15888
PCT Pub. Date: Sep. 17, 1992

[30] Foreign Application Priority Data

Mar. 6, 1991 [DE] Fed. Rep. of Germany ... 9102669[U]

[51] Int. Cl.⁵ .......................... G01C 3/08; G01P 3/36; G01R 19/00
[52] U.S. Cl. ...................... 356/28.5; 356/5; 324/76.48
[58] Field of Search ............... 356/5, 28.5; 324/76.48

[56] References Cited

U.S. PATENT DOCUMENTS

| | | | |
|---|---|---|---|
| 3,689,921 | 9/1972 | Berry . | |
| 4,297,030 | 10/1981 | Chaborski | 356/5 |
| 4,715,706 | 12/1987 | Wang | 356/5 |
| 4,974,960 | 12/1990 | Dopheide et al. | 356/28.5 |
| 5,198,750 | 3/1993 | Proklin . | |

Primary Examiner—Stephen C. Buczinski
Attorney, Agent, or Firm—Banner, Birch, McKie & Beckett

[57] ABSTRACT

An electrical circuit has, for measuring the frequency of laser Doppler signals, at least one counter for counting the signal pulses and a microprocessor for evaluating the counter reading which is produced within a measuring interval. A high degree of accuracy in the frequency measurement of laser Doppler signals is achieved, in that for controlling the pulse count a blocking element, such as an And-gate (2), which is controlled by means of an additional signal, for example by an automatic band pass, is connected in series with the laser signal pulse counter (4), and also in that there is arranged a time pulse counter (7) which is connected for example to a quartz pulse generator (8) and determines the measuring interval by means of a predetermined number of pulses, and finally in that the laser signal pulse counter (4) and the time pulse counter (7) are connected to a microprocessor (14) for reading the counter readings on completion of a measuring interval.

18 Claims, 2 Drawing Sheets

ELECTRICAL CIRCUIT FOR MEASURING THE FREQUENCY OF LASER DOPPLER SIGNALS

The invention relates to an electrical circuit for measuring the frequency of laser Doppler signals, having at least one counter for counting the signal pulses and having a microprocessor for evaluating the counter reading produced within a measuring interval.

Especially when measuring the speed of a moved surface by means of laser beams which are guided onto the moved surface and the reflected dispersed light thereof is measured and evaluated to determine the speed information, there are usually produced laser Doppler signals having an undesirable amplitude, phase and frequency modulation which is based on interference in the measuring volume and caused by changes in the moved surface. When determining the frequency of laser Doppler signals which contain speed information, this modulation has a very disadvantageous effect. This is because for frequency determination the number of signal pulses which occur within a predetermined measuring interval is counted for example by means of a standard frequency counter, in particular in rigidly predetermined asynchronous intervals. However, as a result of modulation, no countable pulses occur during certain periods of time, so that the determined frequency is defective, i.e. is below the actually existing frequency. This is because the counter counts the number of pulses within the predetermined time interval, and the frequency is calculated from the number of counted pulses by taking the average. If there arises within the predetermined time interval a relatively large gap within which no countable pulse occurs, then the established average value becomes inaccurate.

In practice, the remedy is to use as small as possible a division of the measuring intervals, so that intervals in which no pulses are counted are discarded and are not taken into account in the frequency calculation. However, even in the case of dividing a measuring interval into as many small intervals as possible the measuring method is ultimately the same, the only difference being that as a result of the higher quantization ultimately a higher degree of accuracy is achieved, but without basically removing the error. This is because to do this would necessitate a division of the measuring intervals of such smallness that much more calculating capacity is involved in the evaluation of the measuring intervals than exists today.

If a signal were derived which provides information on whether pulses are present, for example derived from the amplitude of the laser Doppler signal, then information can be lost, since the measurement of an entire interval is discarded although the additional signal has given the message "no pulses" only for the smallest part.

Instead of frequency measurement, there is also possible period length measurement from the result of which the frequency can be calculated with the aid of the equation $f=1/T$. Here, only a single valid oscillation is necessary to determine the frequency. This is also done very fast. However, this method is ultimately inaccurate, since the period length is subject, as a result of the phase and frequency modulation mentioned at the outset, to greater statistical variation. Moreover, this method requires high measuring expenditure and above all very high-performance hardware.

It is therefore the object to provide an electrical circuit by means of which the accuracy of the frequency measurement from laser Doppler signals can be very substantially increased without a disproportionately high level of expenditure being necessary for this.

According to the invention, the object is achieved in that for controlling the pulse count a blocking element, such as an And-gate, which is controlled by an additional signal, for example by an automatic band pass, is connected in series with the laser signal pulse counter, in that there is arranged a time pulse counter which is connected for example to a quartz pulse generator and determines the measuring interval by means of a predetermined number of pulses, and in that the laser signal pulse counter and the time pulse counter are connected to a microprocessor for reading the counter readings on completion of a measuring interval.

According to the invention, the laser signal pulse counter is consequently controlled by an additional signal, which is preferably emitted by an automatic band pass, so that only valid signals are counted by the laser signal pulse counter. In the case of invalid signal pulses, the laser signal pulse counter is blocked by the And-gate. Counting of the signals by the laser signal pulse counter is related to time by means of the arrangement of the time pulse counter wherein a rigidly defined time interval is predetermined by a set number of pulses. The measuring aim is namely to count the laser Doppler signal pulses within a rigidly defined measuring interval, i.e. within a predetermined period of time. According to the invention, the laser Doppler signal pulses are counted in the laser signal pulse counter, which is controlled by the additional signal, while the time pulses, for example in the form of quartz pulses are counted in the other counter, namely the time pulse counter. When the measuring interval is complete, i.e. when the predetermined number of pulses has been counted in the time pulse counter and thus the time pulse counter has been brought to the value zero, the counter readings of both counters are read off by the microprocessor, and the quotient of both counter readings leads directly to the laser Doppler frequency to be measured and thus to the desired speed information.

Preferably, the additional signal transmitter for synchronizing the pulse counts is coupled to the laser signal pulse counter and to the time pulse counter. Both counting procedures are consequently controlled by the additional signal. Here, a further synchronization between the additional signal and the counter signals is advantageous so as not to obtain any metastable states or any distortion in the pulse numbers on switching the counting on and off.

As has already been described, measuring continues until enough pulses have been counted into the time pulse counter for the measuring interval to be complete. Reading of the laser signal pulse counter is then triggered, and this must be effected in synchronized manner so that a straight-running measuring procedure, predetermined by a valid additional signal, is not disrupted.

A further development of the invention consists in the fact that the laser signal pulse counter has a connection to the time pulse counter such that in the case of small laser Doppler frequencies and consequently few pulses per measuring interval a transition to period length measurement occurs. The invention permits this transition without further measures. This means that the arrival of a predetermined number of pulses in the laser signal pulse counter triggers an interrupt signal and prompts a reading of the time pulse counter, so that a sufficient resolution is possible despite low frequency. In this case, the measuring interval is consequently determined not by a predetermined number of pulses of the time pulse counter, but by a predetermined number of laser signal pulses which bring about a reading and a comparison of the counter readings.

The arrangement according to the invention chiefly has the following advantages over conventional systems:

no loss of information,
independent averaging over the measuring interval,
no load made on the system by high cycle or interval rates,
average value interval can be adjusted,
uninterrupted measurement is possible,
direct supply of the frequency as a quotient of the two counter readings.

Figure 2:
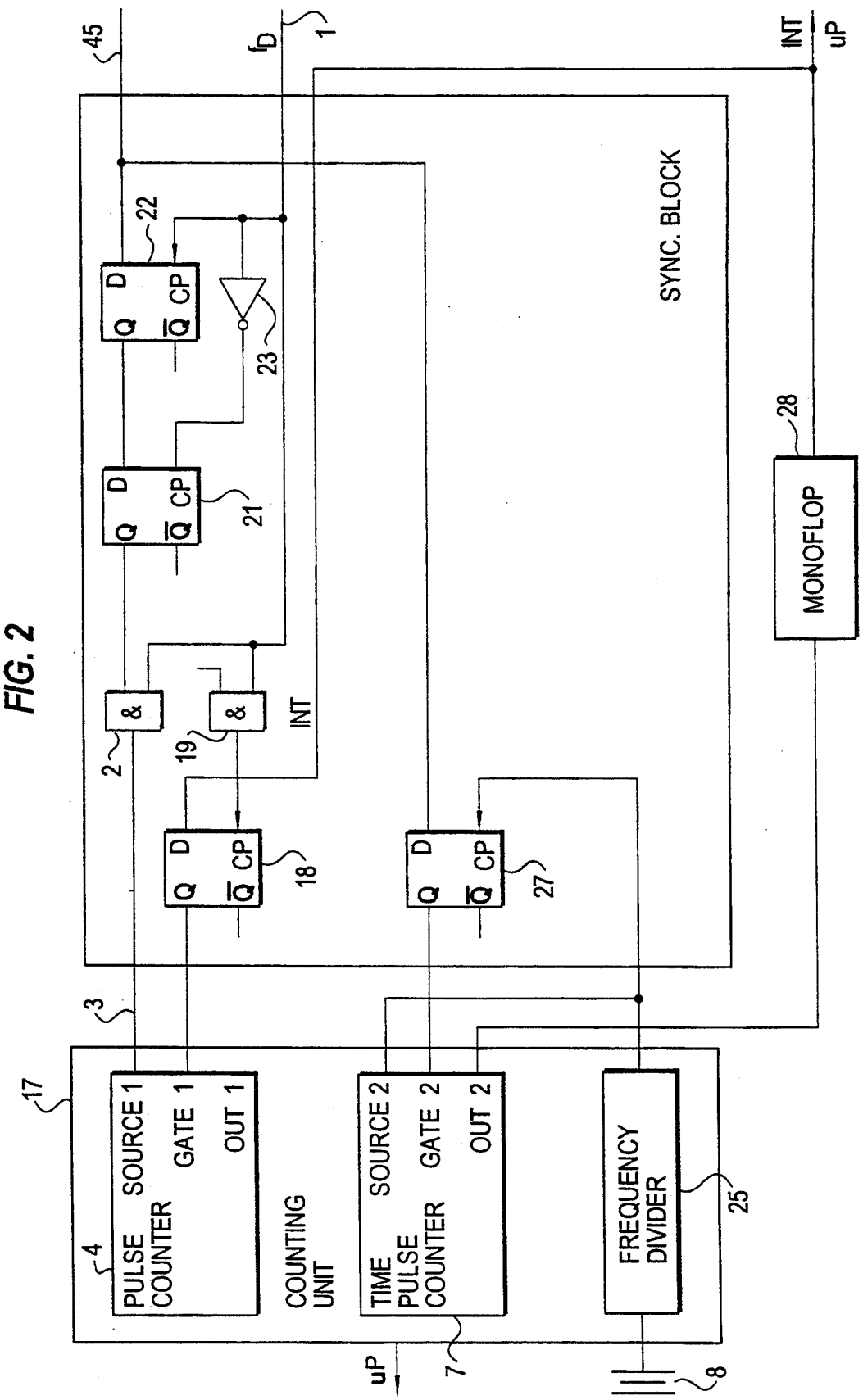

Further advantages of the invention emerge from the subsequent description and from the drawing of an example embodiment which will be described in detail below with reference to the drawing, in which an electrical circuit is illustrated diagrammatically, and in which:

FIG. 1 illustrates a complete circuit plan, and
FIG. 2 illustrates a detail of the circuit of FIG. 1 illustrating a synchronization of signal pulses.

By way of a line 1, pulses of laser Doppler signals having the frequency $f_D$ pass to an And-gate 2 and from there by way of a line 3 to a laser signal pulse counter 4. The control of the And-gate 2 is effected by means of an additional signal 30 which stops if the additional signal generator 46, such as an automatic band pass, which emits the additional signal, discards signals or pulses. The additional signal reaches the And-gate 2 by way of lines 5, 6.

In this manner, the laser signal pulse counter 4 can count all the pulses which reach it by way of the And-gate 2, but without the time reference which is necessary for the measurement or the evaluation and which is produced according to the invention by a time pulse counter 7 which supplies pulses from a quartz pulse generator 8 by way of a line 9, an AND-gate 10 and a line 11 to the time pulse counter 7, of which pulses a predetermined number forms a measuring interval. If this predetermined number of pulses is counted in the time pulse counter 7 and the time pulse counter 7 is consequently brought to zero, a reading of the laser signal pulse counter 4 is triggered by it. Both counter readings are then transferred by way of a line 12 or 13 to a microprocessor 14 which determines the desired frequency information from the quotient of both counter readings.

So that no metastable states or a distortion in the pulse numbers occur at the beginning and end of a measuring interval, a synchronization of the pulses to be counted by the laser signal pulse counter 4 and by the time pulse counter 7 is effected by the additional signal which also controls the And-gate 10 to this end by way of the line 5 and a line 15. The asterisk in the drawing signifies that all the conjunctions, reading, setting and re-setting operations are synchronized with the respective signal, as is illustrated in the circuit of FIG. 2.

A connection by means of a line 16 between the laser signal pulse counter 4 and the time pulse counter 7 serves to indicate that the measurement in the case of a predetermined number of pulses per measuring interval being undershot, i.e. if the resolution in relatively small Doppler frequencies becomes unfavourable, alters from a frequency to a period length measurement. In this case, the measuring interval is determined by a predetermined number of pulses arriving in the laser signal pulse counter. If this number of pulses is achieved, a reading of the counter reading of the time pulse counter 7 is prompted by the laser signal pulse counter 4, and the read-off time value is compared with the predetermined pulse number in order to determine the period length from which the frequency can be calculated.

The circuit according to FIG. 2 is described below:

The pulse counter of the counting unit 17 is only to count the Doppler frequency when the additional signal is at high level. The pulses of laser Doppler signals having the frequency $f_D$ pass by way of the And-gate 2 to the counting input (source 1) of the pulse counter 4.

Since in the case of a direct And-conjunction of the pulses of the frequency $f_D$ and the additional signal some edges of the pulses having the frequency $f_D$ are lost during counting or are even generated in addition, it is necessary first to synchronize the additional signal with the pulses having the frequency $f_D$ and then to carry out an And-conjunction.

In the case of the And-conjunction in the And-gate 2 it is thus ensured that the additional signal only has rising or falling edges when the pulse concerned having the frequency $f_D$ is at low level, so that no additional edge is generated or lost in the And-conjunction.

The delay of the flip-flops 18, 21 and 27 and of the gate and the inverter 23 is approx. 50 ns.

The additional signal 43 (always the signal VALID) is adopted in the flip-flop 22 along with the rising edge of the pulses having the frequency $f_D$ and appears after the delay at the output Q of the flip-flop 22 or at the input D of the flip-flop 21.

The flip-flop 21 adopts the signal with the falling edge of the pulse concerned having the frequency $f_D$ (inversion of $f_D$ in the inverter 23) and puts it after the delay onto the And-gate 2 whereof the second input is $f_D$. It can be understood from this that the additional signal can only ever alter 50 ns after the falling edge of the pulses having the frequency $f_D$. The And-conjunction is effected in the And-gate 2. If the additional signal is at high level, then the pulses having the frequency $f_D$ appear in the pulse counter 4.

A rising edge at gate 1 of the pulse counter 4 prompts the pulse counter 4 to write the counter reading internally into a hold register and to continue counting immediately. The microprocessor $\mu$P can read the counter reading from the hold register.

The rising edge at gate 1 of the pulse counter 4 may only, however, occur at the earliest 37 ns after a rising edge at source 1 and at the latest 100 ns before a rising edge at source 1. This is ensured by the flip-flop 18. The edge appears later at gate 1 by the delay of the flip-flop 18 (50 ns) than it does at source 1.

The rising edge is generated by the quartz pulse generator 8, passes through the frequency divider 25, reaches the time pulse counter 7 and the flip-flop 27 and the monoflop 28, if the additional signal has been at high level for a predetermined period of time.

The frequency generated in the quartz pulse generator 8 and in the frequency divider 25 is applied to source 2 of the time pulse counter 7. The time pulse counter 7 is pre-loaded with a predetermined pulse number by means of the microprocessor $\mu$P. By means of the additional signal (synchronized with the source 2 signal in the flip-flop 27, cf. description of the flip-flop 18) located at gate 2 counting is only effected when gate 2 of the time pulse counter 7 is at high level. If the time pulse counter 7 reaches the pre-loaded pulse number, then 1. a pulse is released at OUT 2,
2. the time pulse counter 7 is internally set to 0, and
3. the next count is counted again.

The pulse released at OUT 2 passes by way of the monoflop 28 to the flip-flop 18 and there prompts the transfer of the counter readings (see above). Equally, the signal INT (interrupt) passes to the microprocessor $\mu$P and there initiates a program in order to read the counter reading of the reading signal pulse counter 4.

List of Reference Numerals

1 = Line
2 = AND-gate
3 = Line
4 = Pulse counter
5 = Line
6 = Line
7 = Time pulse counter
8 = Quartz pulse generator
9 = Line
10 = AND-gate
11 = Line
12 = Line
13 = Line
14 = Microprocessor
15 = -Line
16 = Line
17 = Counting unit
18 = Flip-flop
19 = AND-gate
20 = -
21 = Flip-flop
22 = Flip-flop
23 = Inverter
24 = -
25 = Frequency divider
26 = -
27 = Flip-flop
28 = Monoflop
29 = -
30 = Additional signal
31 = Counter reading 1
32 = Reading
33 = Pre-selection value
34 = Pre-selection reached
35 = Counter reading 2

$$36 = f = \frac{\text{Counter reading 1}}{\text{Counter reading 2}}$$

37 = Size of the average value interval

We claim:

1. An electrical circuit for measuring the frequency of laser Doppler signals, comprising:
    a laser pulse counter for counting laser signal pulses;
    a blocking element, controlled by an additional signal, in series with said laser signal pulse counter, for controlling said laser signal pulse counter;
    a time pulse counter for determining a measuring interval, said time pulse counter receiving pulses from a pulse generator, and determining the measuring interval based on the presence of a predetermined number of pulses;
    a microprocessor for receiving a count from said laser pulse counter at the end of said predetermined measuring interval and outputting an indication of the frequency of said laser signal pulses.

2. The electrical circuit of claim 1 wherein said blocking element comprises an And-Gate.

3. The electrical circuit of claim 1 wherein said additional signal is produced by an automatic band pass.

4. The electrical circuit of claim 1 where said pulse generator comprises a quartz pulse generator.

5. The electrical circuit of claim 1, further comprising an additional signal transmitter for synchronizing the pulse counters, said additional signal transmitter being coupled to the laser signal pulse counter and the time pulse counter.

6. The electrical circuit of claim 1, wherein said laser signal pulse counter is connected to said time pulse counter, such that a transition from frequency measurement to period measurement is triggered if the number of signal pulses during the measuring interval is less than a predetermined number.

7. The electrical system of claim 1, wherein said blocking element is an And-Gate, said additional signal is produced by an automatic band pass, and said pulse generator is a quartz pulse generator.

8. The electrical circuit of claim 7, further comprising an additional signal transmitter for synchronizing the pulse counters, said additional signal transmitter being coupled to the laser signal pulse counter and the time pulse counter.

9. The electrical circuit of claim 7, wherein said laser signal pulse counter is connected to said time pulse counter, such that a transition from frequency measurement to period measurement is triggered if the number of signal pulses during the measuring interval is less than a predetermined number.

10. An electrical circuit for measuring the frequency of laser Doppler signals, comprising:
    a laser pulse counter for counting laser signal pulses;
    a blocking element, controlled by an additional signal, in series with said laser signal pulse counter, for controlling said laser signal pulse counter, said additional signal indicating whether a received laser signal pulse is a valid pulse, and passing said received laser signal pulse to said laser pulse counter only if said additional signal indicates that the received laser signal pulse is valid;
    a time pulse counter for determining a measuring interval, said time pulse counter receiving pulses from a pulse generator, and determining the measuring interval based on the presence of a predetermined number of pulses;
    a microprocessor for receiving a count from said laser pulse counter at the end of said predetermined measuring interval and outputting an indication of the frequency of said laser signal.

11. The electrical circuit of claim 10 wherein said blocking element comprises an And-Gate.

12. The electrical circuit of claim 10 wherein said additional signal is produced by an automatic band pass.

13. The electrical circuit of claim 10 where said pulse generator comprises a quartz pulse generator.

14. The electrical circuit of claim 10, further comprising an additional signal transmitter for synchronizing the pulse counter, said additional signal transmitter being coupled to the laser signal pulse counter and the time pulse counter.

15. The electrical circuit of claim 10, wherein said laser signal pulse counter is connected to said time pulse counter, such that a transition from frequency measurement to period measurement is triggered if the number of signal pulses during the measuring interval is less than a predetermined number.

16. The electrical system of claim 10, wherein said blocking element is an And-Gate, said additional signal is produced by an automatic band pass, and said pulse generator is a quartz pulse generator.

17. The electrical circuit of claim 16, further comprising an additional signal transmitter for synchronizing the pulse counters, said additional signal transmitter being coupled to the laser signal pulse counter and the time pulse counter.

18. The electrical circuit of claim 16, wherein said laser signal pulse counter is connected to said time pulse counter, such that a transition from frequency measurement to period measurement is triggered if the number of signal pulses during the measuring interval is less than a predetermined number.

* * * * *